(12) United States Patent
Becker et al.

(10) Patent No.: US 8,181,098 B2
(45) Date of Patent: May 15, 2012

(54) ERROR CORRECTING VITERBI DECODER

(75) Inventors: Christopher J. Becker, Palatine, IL (US); Kevin B. Traylor, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 1008 days.

(21) Appl. No.: 12/157,512

(22) Filed: Jun. 11, 2008

(65) Prior Publication Data
US 2009/0313530 A1    Dec. 17, 2009

(51) Int. Cl.
*G06F 11/00* (2006.01)
(52) U.S. Cl. ......... 714/796; 714/792; 714/794; 714/795
(58) Field of Classification Search .................. 714/792, 714/794, 795, 796
See application file for complete search history.

(56) References Cited

U.S. PATENT DOCUMENTS

| | | | |
|---|---|---|---|
| 5,577,053 A | | 11/1996 | Dent |
| 5,784,392 A | * | 7/1998 | Czaja et al. ............ 714/786 |
| 6,108,386 A | * | 8/2000 | Chen et al. ............ 375/341 |
| 6,199,186 B1 | * | 3/2001 | Chen et al. ............ 714/755 |
| 6,378,106 B1 | * | 4/2002 | Allpress et al. ............ 714/795 |
| 6,438,121 B1 | * | 8/2002 | Hammons et al. ............ 370/345 |
| 6,556,632 B1 | * | 4/2003 | Kubo et al. ............ 375/341 |
| 7,042,964 B2 | | 5/2006 | Muck et al. |
| 7,480,852 B2 | * | 1/2009 | Hedayat et al. ............ 714/794 |
| 7,975,212 B2 | * | 7/2011 | Shieh et al. ............ 714/791 |
| 8,037,396 B2 | * | 10/2011 | Alamouti ............ 714/792 |
| 2008/0092025 A1 | * | 4/2008 | Hedayat et al. ............ 714/792 |

* cited by examiner

*Primary Examiner* — Marc Duncan

(57) ABSTRACT

Methods and corresponding systems in a Viterbi decoder include computing a maximum likelihood (ML) path in a Viterbi trellis in response to executing a first Viterbi algorithm. Thereafter, one or more merge points are selected on the ML path in a second Viterbi algorithm, wherein the merge points each have a path metric difference, which is a difference between an ML path metric at the merge point and a non-surviving path metric at the merge point. Merge points are selected based upon relative path metric differences associated with nodes on the ML path. Next, alternate paths in the Viterbi trellis are computed based on the ML path with alternate paths substituted at corresponding merge points. A passing decoded bit sequence is output in response to passing an error check, wherein the passing decoded bit sequence is associated with one of the one or more alternate paths.

20 Claims, 5 Drawing Sheets

ERROR CORRECTING VITERBI DECODER

BACKGROUND

1. Field

This disclosure relates generally to a decoder in a communication system, and more specifically to a Viterbi decoder having error correction and corresponding methods therein.

2. Related Art

Many data processing systems receive and process data, so it is desirable to increase performance in the error-free reception of data. Convolutional coding is a technique that can be used to reduce the error rate in transferring or transmitting digital data. A convolutional code is a type of error-correcting code, wherein a block of data set for transmission can be encoded prior to transmission, and then decoded after reception. In one example, an encoder may have an input that receives one bit and outputs three encoded bits, in which case a "rate" of the encoder is ⅓ (i.e., one bit in produces three bits out). Additionally, each of the three bits output is a function of the previous k-bits input, wherein "k" can be referred to as the constraint length of the code.

To provide a method for error detection, the block of data set for transmission, which can be called the "message data," can be associated with, or accompanied by, additional data that can be used at the receiving end to detect an error. One known type of error detection is a cyclic redundancy check (CRC). Prior to transmission, the message data portion of the data block can be analyzed to calculate an additional field of data, which can be referred to as a CRC. Upon reception in the receiver, a CRC can also be calculated based on the received message data. The CRC calculated in the receiver is then compared to the CRC in the received data. If the calculated CRC matches the received CRC, the message data block can be deemed correct.

A Viterbi decoder is a type of data decoder that can be used in a receiver, or other data processor, to decode a bitstream that has been convolutionally encoded. The Viterbi algorithm in the decoder performs a maximum likelihood decoding algorithm to identify a statistically most likely path through a decoder trellis diagram. A Viterbi decoder can be used in decoding convolutional codes in devices such as satellite communication systems, telephone-line modems, in computer storage devices such as hard disk drives, and other similar devices.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
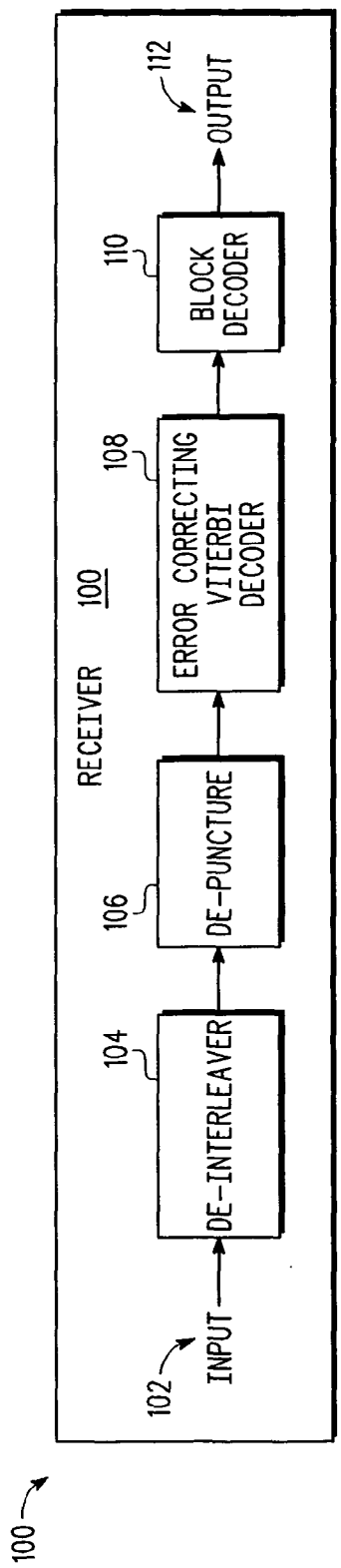
FIG. 1 is a high-level block diagram of a communication system, or a data processing system, that receives and decodes encoded data in accordance with one or more embodiments.

Referring to FIG. 1, there is depicted a high-level block diagram of a receiver, which can be used in a communication system, or a data processing system, to receive and decode encoded data in accordance with one or more embodiments. Receiver 100 can be any device or data processor that receives a stream of convolutionally encoded channel symbols (e.g., input data 102) that can be decoded with a Viterbi decoder. For example, receiver 100 can be used in a wireless subscriber unit in a mobile wireless communication system, or in a telephone-line modem, or in a circuit for decoding data read from the media in a mass storage unit, such as a disk drive, or CD or DVD reader.

In the embodiment of FIG. 1, input data 102 can be pre-processed before decoding, depending upon the various processes performed upon the data prior to convolutional encoding. For example, input data 102 can first be processed by de-interleaver 104, which can reorder the data that has been interleaved at the transmitter (or other data source). Following de-interleaver 104, de-puncture function 106 can add erasure bits back into a punctured data stream to allow the decoder to work at the proper rate.

The output of de-puncture function 106 can be fed into error correcting Viterbi decoder 108. In one embodiment, error correcting Viterbi decoder 108 computes a most likely sequence of received channel symbols and performs an error check on a decoded bit sequence corresponding to such a sequence of channel symbols. If the error check passes, error correcting Viterbi decoder 108 can output (e.g., pass to the next data processing function) a decoded bit sequence (i.e., decoded bits) corresponding to the most likely sequence of received channel symbols. If the error check fails, error correcting Viterbi decoder 108 can attempt to create and find an alternate sequence of decoded bits that will pass the error check. If such a "passing" sequence is found, error correcting Viterbi decoder 108 can output a decoded bit sequence corresponding to the alternate sequence of channel symbols, which has passed the error check.

The decoded bit sequence output by error correcting Viterbi decoder 108 can be passed to block decoder 110. Block decoder 110 can be used to convert decoded bits into message bits, where such message bits represent the actual data message, or data "payload."

Figure 2:
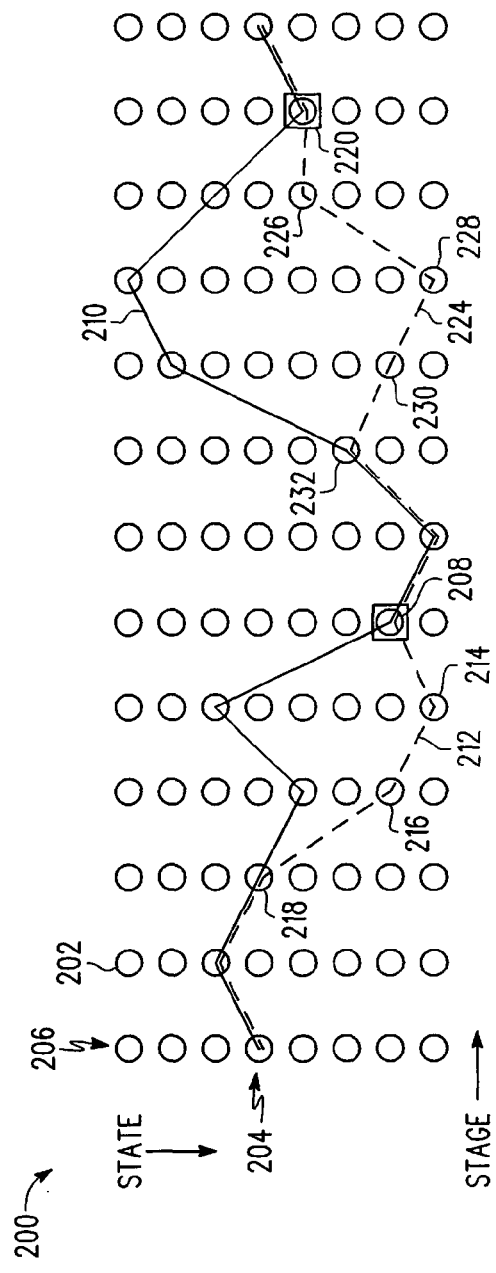
FIG. 2 is a trellis diagram used for decoding in accordance with one or more embodiments.

Referring now to FIG. 2, there is depicted a diagram of a Viterbi trellis 200 in accordance with one or more embodiments. As shown, Viterbi trellis 200 is a decoder trellis that can be used to set a structure, or a graphical means for organization, for decoding convolutionally encoded data. Viterbi trellis 200 is comprised of a plurality of nodes 202 (e.g., circles) arranged in rows and columns. Each row of nodes in the trellis, such as row 204, corresponds to one of a plurality of possible states of the encoder. Each column in the trellis, such as column 206, corresponds to a stage in the decoding process, where the stages can also correspond to a time in the decoding process. At each stage, there are $2^{k-1}$ states in the trellis, where "k" is the constraint length of the code. In one embodiment, an encoder using a constraint length of k=7 can be used.

A line (typically referred to as a branch) connecting a node in one stage to a node in the next stage can graphically represent a state transition that occurs based on the reception of a code word. A sequence of state transitions (or branches) through the trellis can be referred to as a "path," wherein the path represents a corresponding sequence of received channel symbols, which in turn corresponds to a sequence of bits input into the encoder.

The basis of the Viterbi decoding algorithm is the following observation: if any two paths in the trellis merge into a single node, one of the paths can always be eliminated in the search for the optimum path. The Viterbi algorithm involves calculating a measure of similarity, or a measure of distance, or a measure of quality, between the received channel symbols, at stage $s_i$, and all possible received channel symbols associated with trellis paths entering each state at stage $s_i$.

Thus, in Viterbi trellis 200 two paths can lead to a given node (e.g., see node 208), but only one can be the most likely path to that node, i.e., the path with the best metric. The most likely path to a node is called the "surviving path," and the path that is not the most likely path to that node is called the "non-surviving path" because it can be eliminated as a candidate in the search for the most likely path through Viterbi trellis 200.

In FIG. 2, at the end of the Viterbi algorithm, the most likely path through the trellis is ML path 210, which is shown with a solid line. Note that in many applications, the Viterbi trellis 200 can have many more states and many more stages. Therefore, Viterbi trellis 200 can represent only a portion of a relatively small trellis. For example, Viterbi decoders for decoding a data block having 190 bits of data can include 64 states in 196 stages. Extra stages can be included for flushing the encoder memory. In this example, there can be one bit per stage, and, if k=7, six additional bits can be used to flush (i.e., reset to zero) the encoder stages.

When a non-surviving path is eliminated in the trellis, the decision can be based upon accumulated branch metrics that measure the "distance" between the combinations of channel symbols received and all of the possible channel symbol combinations that could have been received. In one embodiment, the distance measurement is a Hamming distance, which is a distance computed by simply counting how many bits are different between the received channel symbol and the possible channel symbols. The Hamming distance (or other metric that may be used) that is computed at each transition between stages can be called branch metrics. Path metrics can be calculated by accumulating the branch metrics over the series of transitions, or branches, that form the path.

Figure 3:
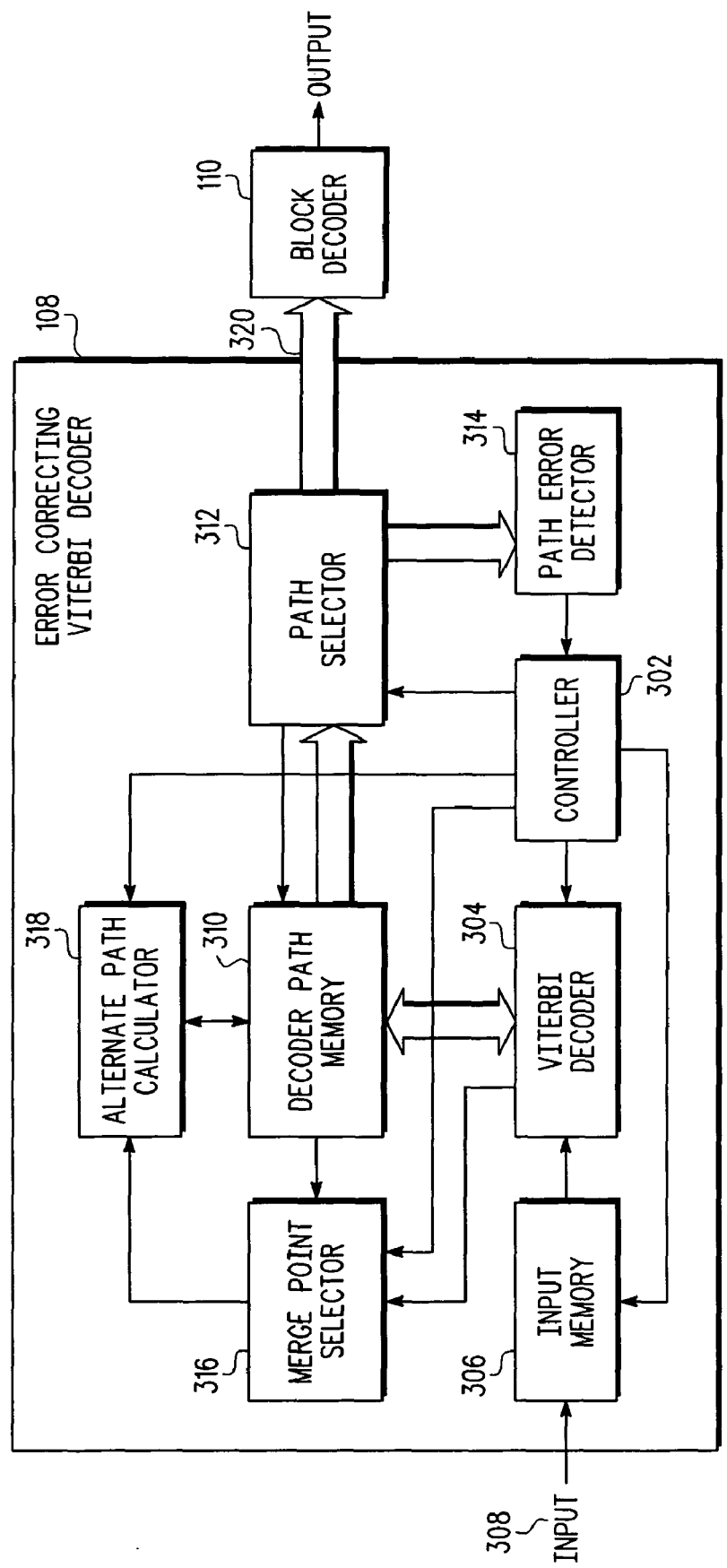
FIG. 3 is a high-level block diagram of an error correcting Viterbi decoder in accordance with one or more embodiments.

Referring now to FIG. 3, there is depicted a more detailed block diagram of error correcting Viterbi decoder 108 in accordance with one or more embodiments. As shown, error correcting Viterbi decoder 108 can include controller 302, which can be used to control and synchronize the operation of various other functional blocks. For example, controller 302 can be coupled to Viterbi decoder 304 and input memory 306 for controlling the execution of a Viterbi decoding algorithm using data stored in input memory 306. In one embodiment, controller 302 can be implemented with a state machine, or logic circuit. In another embodiment, controller 306 can be implemented with a microcontroller executing appropriate microcode.

Input memory 306 can be used to store channel symbols 308, wherein a group of channel symbols 308 represent a block of encoded data that has been received for decoding. In some embodiments, channel symbols 308 have been processed by de-interleaver 104 and de-puncture function 106, as shown in FIG. 1. Input memory 306 can receive or buffer channel symbols 308, and then provide the buffered channel symbols to Viterbi decoder 304 as needed for one or more block decoding operations according to control signals from controller 302.

Viterbi decoder 304, which is generally known, can be used to execute a Viterbi algorithm to decode a block of channel symbols. The Viterbi decoder 304 can include internal memory registers and circuits for storing data structures, and for storing and calculating branch and path metrics associated with various nodes in a Viterbi trellis, e.g., Viterbi trellis 200. Additionally, decoder path memory 310 can be coupled to Viterbi decoder 304 for storing data representing various paths through Viterbi trellis 200. Decoder path memory 310 can also be used to make various path data and metrics available to other functional blocks in error correcting Viterbi decoder 108. For example, decoder path memory 310 can be used to store decoded bits corresponding to various paths through Viterbi trellis 200, including a most likely path (i.e., ML path) and other alternate paths.

Path selector 312 can be used to recall, from decoder path memory 310, decoded bits corresponding to various paths through Viterbi trellis 200, which paths can include the ML path and other alternate paths. Path selector 312 can be coupled to controller 302 for receiving control signals that control recalling, or selecting, particular decoded bits associated with a particular path. Path selector 312 can be coupled to decoder path memory 310 for providing control signals that select the decoded bits, and also for receiving the selected decoded bits in response to the control signals.

Path selector 312 can provide an output coupled to path error detector 314 for transferring a selected decoded bit sequence corresponding to a selected path. Path error detector 314 can perform an error detection function using the selected decoded bit sequence. In one embodiment, the decoded bits can include a plurality of bits in a cyclic redundancy check (CRC) field. Path error detector 314 can calculate a CRC based on decoded bits in a message field, and compare the computed CRC to the received CRC from the CRC field. If the computed CRC matches the received CRC, then the decoded bits can be deemed correct, or error free. However, if the computed CRC does not match the received CRC, then the block of decoded bits can be deemed erroneous, corrupt, or otherwise not decoded correctly. Path error detector 314 can be coupled to controller 302 in order to communicate the error condition or status of the decoded bits.

Additionally, path selector 312 can provide decoded bits to output 320, which can be coupled to block decoder 110. Block decoder 110 can be used to further process the decoded bits output by error correcting Viterbi decoder 108. In response to an indication that selected decoded bits have passed an error check in path error detector 314, controller 302 can send control signals to path selector 312 for outputting the selected decoded bits at output 320.

Merge point selector 316 can be used to select "merge points" in the ML path, which is stored in decoder path memory 310. The merge point can be defined as a node on the ML path that has a path metric difference between the ML path metric at the node (i.e., the path metric for the partial ML path up to the node under consideration for selection as a merge point) and the non-surviving path metric at the node, wherein the difference meets predetermined criteria for the selection of a merge point. In one embodiment, the predetermined criteria can be related to relative path metric differences, or the relationship between the path metric difference at the node under consideration compared to path metric differences at other nodes on the ML path. In another embodiment, the predetermined criteria can be related to a comparison of the path metric difference at the node under consideration to a threshold difference (i.e., the path metric difference at the node under consideration relative to a threshold).

In FIG. 2, nodes 208 and 220 are examples of merge points, wherein the merge points are graphically distinguished from other nodes by a square surrounding the node. At each merge point, there was a decision made during the Viterbi algorithm with regard to the two paths entering the node of the trellis—a surviving path (which is later determined to be a portion of ML path 210) and a non-surviving path, such as paths 212 and 224 shown with dashed lines.

Merge point selector 316 can be coupled to controller 302 for receiving a control signal to invoke the process of selecting merge points. Merge point selector 316 can be coupled to decoder path memory 310 for receiving data associated with the ML path. Merge point selector 316 can be coupled to Viterbi decoder 304 for receiving data related to branch metric decisions along the ML path, wherein such branch metric decisions are related to selecting a surviving path over a non-surviving path. More specifically, merge point selector 316 can gain access to path metrics and other path data related to non-surviving paths along the ML path as a second execution of the Viterbi algorithm is performed.

Under the control of controller 302, alternate path calculator 318 can be used to select alternate paths (e.g., a second path) through the Viterbi trellis in response to an indication of an error in the ML path. Alternate path calculator 318 can be coupled to controller 302 to receive control signals for initiating the calculation of alternate paths. Alternate path calculator 318 can be coupled to merge point selector 316 for receiving data that indicates the location of merge points along the ML path. Alternate path calculator 318 can be coupled to decoder path memory 310 for receiving data needed to trace back alternate paths from a selected merge point in the Viterbi trellis. Alternate path calculator can also store data related to the resulting alternate path calculations, such as a list of nodes in alternate paths, in decoder path memory 310. Data describing such alternate paths can then be available for selection and recall by path selector 312. In one embodiment, alternate path calculator 318 can include a trace-back unit (not shown) for determining a plurality of alternate path nodes in a non-surviving path extending backwards through the trellis from a selected merge point. Alternate path calculator 318 can also include a node substitution unit (not shown) for substituting the plurality of alternate path nodes selected by the trace-back unit for corresponding nodes (i.e., nodes at corresponding stages) in the ML path to calculate an alternate path.

In one embodiment, controller 302, Viterbi decoder 304, input memory 306, decoder path memory 310, path selector 312, path error detector 314, merge point selector 316, and alternate path calculator 318 can all be implemented in hardware using state machine circuits. In some embodiments, firmware may be used to control various state machines. In another embodiment, each of these functional blocks can be implemented in software, where an appropriate microcontroller or other data processor executes software. The software approach can provide increased flexibility in changing functionality and parameters.

Figure 4:
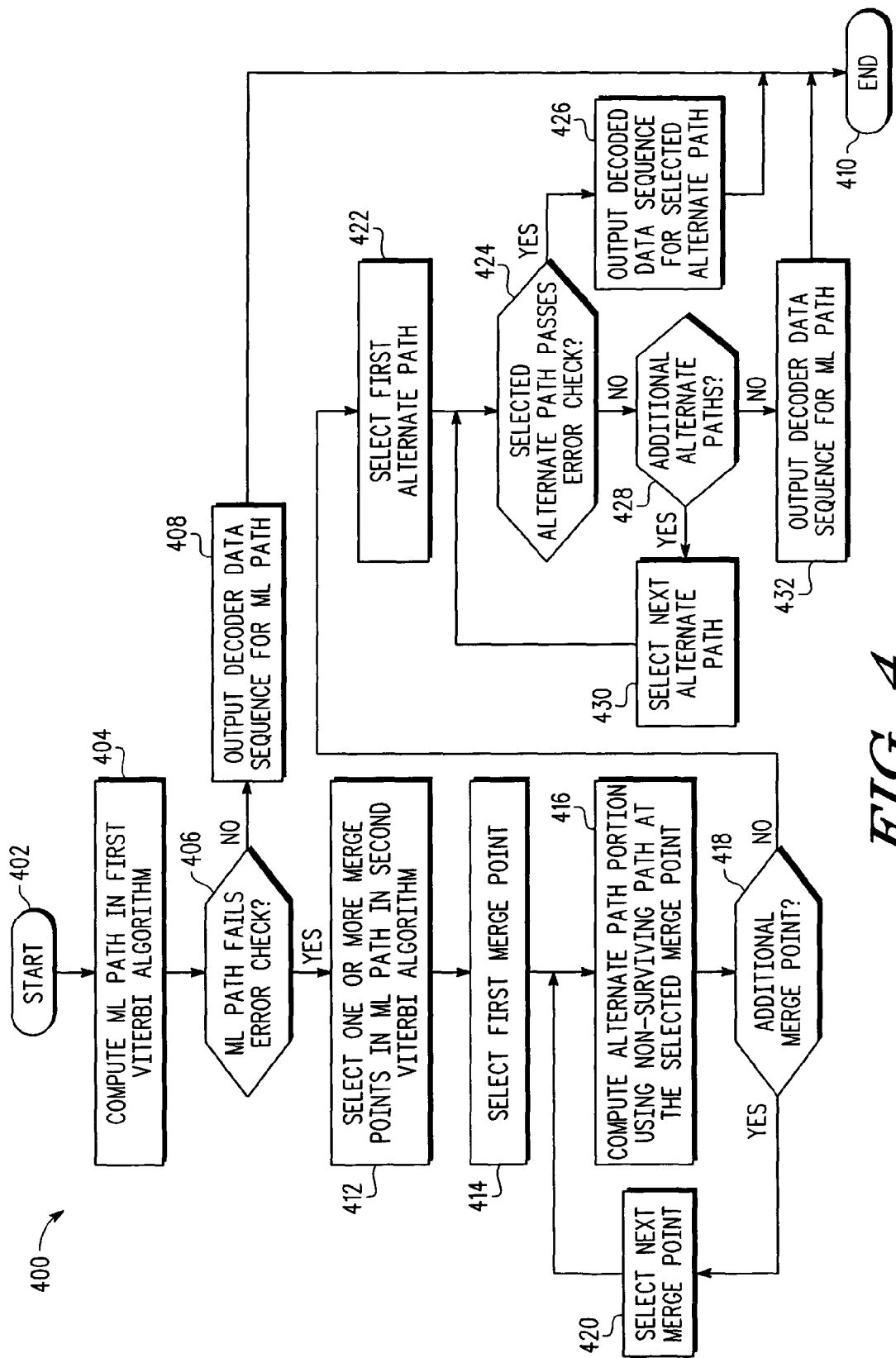
FIG. 4 is a high-level flowchart of one or more processes that can be implemented in an error correcting Viterbi decoder, e.g., as shown in FIG. 1, in accordance with one or more embodiments.

Referring now to FIG. 4, there is depicted a high-level flowchart 400 of one or more processes that can be executed by error correcting Viterbi decoder 108, or another similar circuit with appropriate functionality, in accordance with the one or more embodiments. As shown, flowchart 400 begins at 402, and thereafter passes to 404, wherein the process performs a first Viterbi algorithm on a first block of channel symbols to compute a most likely (ML) path in the Viterbi trellis. In one embodiment, the channel symbols can be input into Viterbi decoder 304 from input memory 306 in response to control signals from controller 302 (see FIG. 3). "Executing a Viterbi algorithm" can include all the processes and calculations needed to input a block of channel symbol data, and, in response, output a series of decoded bits that corresponds to a most likely path through the trellis.

After computing the ML path, the process determines whether the decoded data represented by the ML path fails an error check, as illustrated at 406. In one embodiment, a decoded data block can have a message portion, or field, and an error check portion, or field. Data in the error check portion can include a cyclic redundancy check (CRC) value, which can be compared to a CRC value calculated from the decoded data in the message portion. In another embodiment, another error checking scheme can be used, such as a block code, or another error detecting code.

In an embodiment using a CRC error checking scheme, if the calculated CRC matches the received CRC, the ML path does not fail the error check, and the process can pass to 408, wherein the process outputs a decoded data sequence (i.e., decoded bits) represented by the ML path. After outputting the decoded bit sequence, the process of decoding a block of encoded data ends at 410. In many embodiments, the processes depicted in flowchart 400 can be iteratively repeated for each received data block. For example, if the received data block represents encoded speech data, the processes depicted in flowchart 400 can be iteratively repeated as speech data is streamed to receiver 100 (see FIG. 1), which receiver can include error correcting Viterbi decoder 108.

If, at 406, the ML path fails the error check, the process selects one or more merge points in the ML path during execution of a second Viterbi algorithm, as depicted at 412. A merge point is a selected node along the ML path where the difference between a surviving path metric and a non-surviving path metric at the node is relatively small when compared to the other such path metric differences at other nodes along the ML path. When the difference in path metrics at a node is relatively small, there is a higher likelihood that an error occurred when the Viterbi algorithm chooses between the surviving path and the non-surviving path. Thus, identifying merge points can be considered an attempt to identify a point of a potential decoding error.

Figure 5:
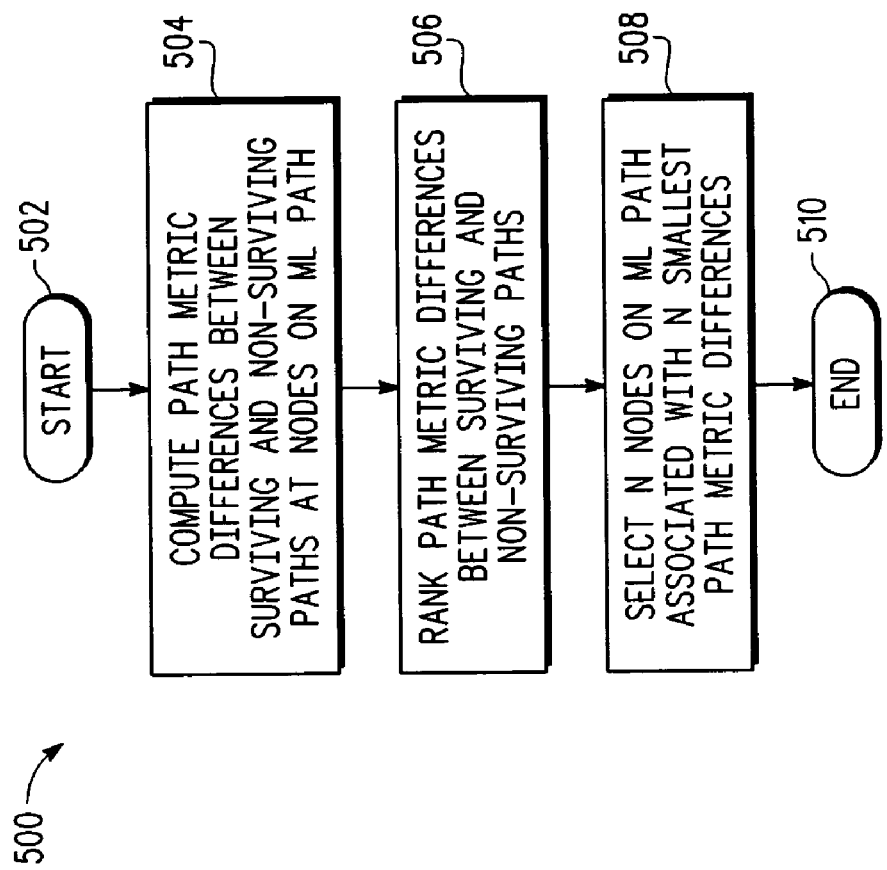
FIG. 5 is a high-level flowchart depicting more detail of one or more processes shown in FIG. 4, in accordance with one or more embodiments.

In one embodiment, the process of selecting one or more merge points can be executed as shown in more detail in flowchart 500 in FIG. 5. As illustrated in FIG. 5, the process of selecting one or more merge points begins at 502, and thereafter passes to 504, wherein the process computes path metric differences between surviving and non-surviving paths at candidate nodes in the ML path. At each node in the ML path (except for the first and second nodes) there are two possible paths (i.e., partial paths through the trellis) leading into the node. According to the Viterbi algorithm, one of these paths will survive as a candidate for the most likely path, and the other path will be dismissed as a non-surviving path because it is a less likely path to the node. The first and second nodes in the ML path are not candidate nodes for merge points because a merge point is a node along the ML path where an alternate path merges back into the ML path after briefly diverging from the ML path at a node at least two stages prior to the node under consideration. Thus, the first and second nodes along the ML path are stages too early in the Viterbi algorithm to be a node at which the ML path and an alternate path merge.

In one embodiment, it can be assumed that the alternate path diverges from the ML path within a number of nodes from the merge point equal to twice the constraint length, k, of the encoder.

Once the process computes the path metric differences for the candidate nodes, the process ranks the path metric differences, as illustrated at 506. This step can be implemented by sorting the path metric differences from smallest to largest. In one embodiment, the path metric differences can be ranked as the second Viterbi algorithm is executed, and path differences become known and are placed in rank order in a list, wherein each time a new smallest difference is found it goes to the top of the list.

After ranking the path metric differences, the process selects N number nodes on the ML path associated with the smallest path metric differences, as depicted at 508. Thus, in a ranked list from smallest to largest path metric differences, the process can select the N smallest differences. In one embodiment, N can be selected as 5.

In various embodiments, path metrics can be "distance" metrics or "quality" metrics. When distance metrics are accumulated as the path metric, the more desirable path metric is a smaller one. When quality metrics are used, the more desirable accumulated path metric is a larger one. However, either type of path metric can be considered when selecting merge points because selecting a merge point considers the difference between the two metrics, and not how large or small the metrics have become.

In another embodiment, merge points can be selected by determining whether the metric differences fall below a difference threshold. If such a difference threshold is used, different numbers of merge points can be selected for different blocks of encoded data, and there is a chance that no merge point will be selected at all.

Once the one more merge points have been selected, the process selects the first merge point, as depicted at 414. Next, the process can compute an alternate path portion using the non-surviving path at the selected merge point, as illustrated at 416. In one embodiment, the process can back trace along the non-surviving path to find a set of nodes that comprise an alternate path portion, which is an alternate path to get to the selected merge point. The alternate path usually deviates from the ML path and merges back into the ML path within a certain number of stages. In one embodiment, the process expects the alternate path portion to diverge and merge with a number of stages equal to twice the constraint length, k, of the encoder. Thus, the process determines an alternate path portion that diverges from the ML path at a stage prior to the merge point and merges into the ML path at the selected merge point.

The process of computing the alternate path portion can, in one embodiment, be implemented using the functions provided by alternate path calculator 318 in FIG. 3. Controller 302 can use control signals to instruct merge point selector 316 to provide alternate path calculator 318 with data regarding the first merge point. After receiving this data, alternate path calculator 318 can access decoder path memory 310 to recall the data needed to back trace a non-surviving path at the selected merge point. Data describing and associated with this alternate path portion can be stored in decoder path memory 310.

In FIG. 2, node 208 is an example of a node that can be selected as the first merge point (i.e., first merge point 208). Non-surviving path 212 is an example of a computed alternate path portion (i.e., first alternate path portion 212). Note that first alternate path 212 merges into ML path 210 at merge point 208. Starting from merge point 208, alternate path calculator 318 can trace back the non-surviving path through nodes 214, 216, and back to 218, which is in the stage where alternate path 212 diverged from ML path 210. In one embodiment, alternate path calculator 318 can trace back a non-surviving path for a length of twice the constraint length, k, of the encoder.

After computing the alternate path portion for the first merge point, the process passes to 418 to determine whether additional alternate paths should be calculated in association with additional merge points. If there are additional merge points, the process passes to 420 wherein a next merge point is selected. After selecting the next merge point, the process iteratively returns to 416 so that the next alternate path portion can be calculated using the currently selected merge point. Note that the first alternate path portion, and any subsequent alternate path portions, can be calculated with data computed and stored during a second execution of the Viterbi algorithm.

In an example where more than one merge point is selected, node 220 (see FIG. 2) can also be selected as merge point 220. Alternate path calculator 318 can be used to determine that second alternate path portion 224 traces back from second merge point 220 through nodes 226, 228, 230, and 232. Note that alternate path portions can be different lengths, as shown by first alternate path portion 212, which deviates from ML path 210 for two nodes (e.g., stages), compared to second alternate path portion 224, which deviates from ML path 210 for three nodes.

Figure 6:
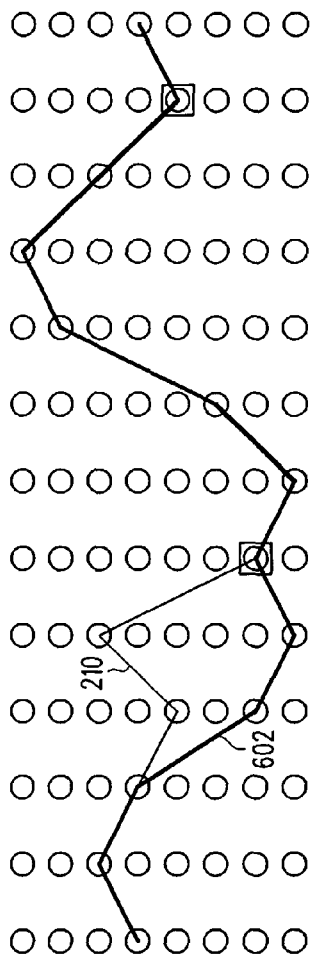
FIGS. 6, 7, and 8 are trellis diagrams that show alternate paths in accordance with one or more embodiments.

If, at 418, there are no additional merge points to consider, the process passes to 422, wherein the process selects the first alternate path. In one embodiment, the first alternate path can be selected by controller 302, which can send control signals to path selector 312 instructing it to recall a decoded bit sequence associated with the first alternate path. FIG. 6 illustrates a complete first alternate path 602 (shown with a bold line) through Viterbi trellis 200. First alternate path 602 has a portion of first non-surviving path 212 substituted for a corresponding portion of ML path 210 at first merge point 208 (e.g., substituted stage-for-stage over a length of the alternate path portion).

Next, the process determines whether the decoded bit sequence associated with the selected alternate path passes an error check, as depicted at 424. In some embodiments, the error check can be a CRC error check, wherein a CRC portion of the decoded data block is compared to a CRC computed from a message portion of the decoded data block. If the error check passes, the process passes to 426, wherein the decoded bit sequence for the selected alternate path is output. Following the data output, the process passes to 410 wherein the process of decoding and error-correcting a block of encoded data ends.

If, at 424, the process determines that the selected alternate path does not pass the error check, the process determines whether additional alternate paths are available for consideration, as depicted at 428. In one embodiment, alternate paths are calculated based upon Boolean combinations of alternate path portions computed at merge points. Thus, if 2 merge points are selected, 3 alternate paths can be computed. If N merge points are selected, $2^N-1$ alternate paths can be computed by substituting alternate paths individually, and in all possible combinations (i.e., all Boolean combinations of alternate paths) into the ML path. Thus, alternate paths are based on the ML path with deviations from the ML path extending back from merge points.

Figure 7:
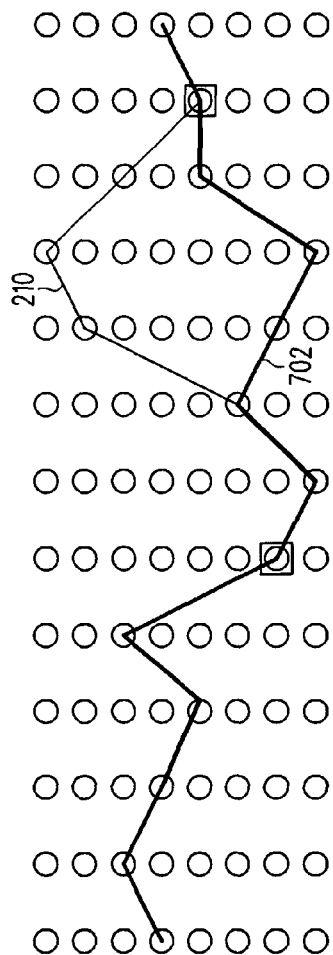
Figure 8:
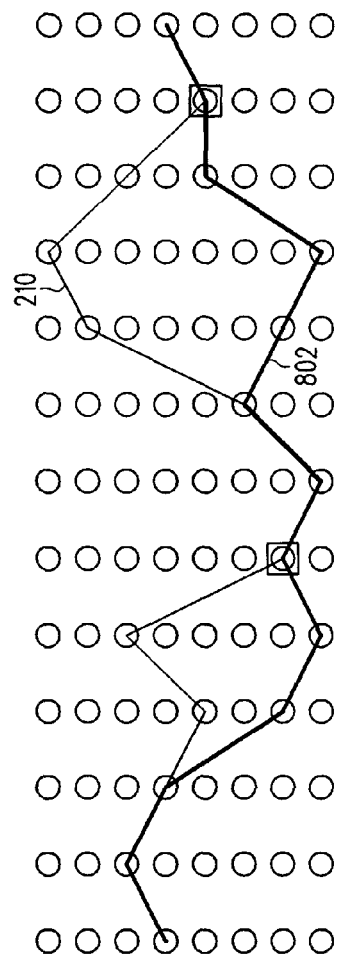

If there are additional alternate paths to consider, the process selects the next alternate path at 430, and then iteratively passes to 424, wherein the alternate path is checked for an error. The processing loop from 424 to 428 to 430 continues until a passing decoded data sequence is found, or until decoded data associated with all alternate paths have been checked for an error. For the example shown in FIG. 2 that has two merge points (208 and 220), the alternate data paths that can be constructed and considered are shown in FIGS. 6, 7, and 8.

If, at 428, there are no additional alternate paths for consideration, the process can output decoded bits associated with ML path 210, and then pass to 410 wherein the process of decoding and error-correcting an encoded data block ends. Alternatively, the process can output another predetermined data block. When data is output at 432, the data can be flagged to indicate there is an error, which can cause an error handler (not shown) in receiver 100 to ignore the data, or to send a request to re-transmit the data, depending upon the importance of the data, and the time required to retransmit the data, and other considerations for handling an erroneously decoded data block.

In one embodiment, at 422 were the first alternate path is selected, each of the $2^N-1$ alternate paths can be ranked in order of path metric differences between the overall path metric of the ML path and the overall path metric of the selected one of the $2^N-1$ alternate paths. By ranking the $2^N-1$ alternate paths based on path differences, the process will likely speed up the process of finding an alternate path that passes the error check.

The techniques of decoding and error-correcting a block of encoded data described above can have several advantages. For example, two or more merge points can be selected during the process of performing one additional iteration of the Viterbi algorithm. This allows $2^N-1$ alternate paths be calculated and checked, in addition to the ML path, without having to perform an additional Viterbi algorithm for each of the $2^N-1$ alternate paths can that can be constructed from N merge points and the corresponding N alternate path portions. In some other approaches that find alternate paths through the Viterbi trellis, larger amounts of data are stored and processed to find two or more complete paths in the Viterbi trellis (e.g., for the ML path and other paths that are candidates for second or third, etc. . . . most likely paths). In this type of approach, it may not be apparent until near the end of the trellis which of many paths is the second or third most likely path, which greatly increases the amount of data storage area needed. Other approaches can require more than two executions of the Viterbi algorithm (e.g., one execution for each alternate path checked), which can require more time and consume additional power.

Another advantage is that only a small amount of additional data is stored for calculating and error checking alternate data paths.

Yet another advantage of error correcting Viterbi decoder 108 is that it can be fabricated with a relatively small increase in circuit components and circuit area. A relatively small amount of additional data is needed to store information describing merge points, alternate path portions, alternate paths, and the like.

Although the invention is described herein with reference to specific embodiments, various modifications and changes can be made without departing from the scope of the present invention as set forth in the claims below. For example, while the techniques and apparatus for decoding and performing error correcting techniques on an encoded data block may vary widely, one or more embodiments can be used in signal processing or communication systems applications. For example, the decoding and error correcting techniques set forth herein can be used in a wireless receiver (e.g., a cellular telephone or other wireless subscriber unit), a set-top cable TV decoder, a mass storage medium data decoder e.g., a disk drive, or DVD or CD reader), or the like. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or an essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method in a Viterbi decoder comprising:
   computing, including executing a first Viterbi algorithm, a maximum likelihood (ML) path in a Viterbi trellis, wherein the Viterbi trellis has a plurality of nodes corresponding to a plurality of trellis states at a plurality of trellis stages;
   selecting during executing a second Viterbi algorithm, a first merge point, wherein the first merge point is a node on the ML path that has a smallest difference between an ML path metric at the first merge point and a first non-surviving path metric at the first merge point compared to other path metric differences at other nodes on the ML path;
   computing a second path in the Viterbi trellis, wherein the second path is based on the ML path with a portion of the first non-surviving path substituted for a corresponding portion of the ML path at the first merge point; and
   in response to a second decoded bit sequence passing an error check, outputting the second decoded bit sequence, wherein the second decoded bit sequence corresponds to the second path.

2. The method in a Viterbi decoder according to claim 1 wherein the selecting a first merge point in the ML path further comprises selecting a first merge point in the ML path in response to a decoded bit sequence corresponding to the ML path failing the error check.

3. The method in a Viterbi decoder according to claim 1 wherein the computing a second path in the Viterbi trellis further comprises:
   tracing back a portion of the first non-surviving path at the first merge point to identify a plurality of second path nodes preceding the first merge point; and
   substituting the plurality of second path nodes for a corresponding plurality of ML nodes to produce the second path.

4. The method in a Viterbi decoder according to claim 1 wherein the outputting the second decoded bit sequence in response to the second decoded bit sequence passing the error check further comprises outputting the second decoded bit sequence in response to a cyclic redundancy check (CRC) value computed on a first portion of the second decoded bit sequence matching a CRC value in a second portion of the second decoded bit sequence.

5. The method in a Viterbi decoder according to claim 1 wherein the selecting the first merge point in the ML path further comprises selecting N merge points in the ML path in response to the executing a second Viterbi algorithm, wherein N is an integer greater than 1, and wherein each of the N merge points is a node on the ML path, and each of the N merge points has one of N smallest path metric differences between an Nth ML path metric at a respective one of the N merge points and an Nth non-surviving path metric at the respective one of the N merge points compared to other path metric differences at other nodes on the ML path.

6. The method in a Viterbi decoder according to claim 5 wherein the selecting N merge points in the ML path in response to executing a second Viterbi algorithm comprises:
  computing path metric differences between surviving and non-surviving paths at nodes on the ML path;
  ranking path metric differences between surviving and non-surviving paths; and
  selecting N nodes in the ML path associated with N smallest path metric differences.

7. The method in a Viterbi decoder according to claim 5 wherein the computing a second path in the Viterbi trellis further comprises computing $2^N-1$ paths in the Viterbi trellis, wherein each of the $2^N-1$ paths is based on the ML path with Boolean combinations of portions of the N non-surviving paths at the respective N merge points substituted for a corresponding portion of the ML path at the respective N merge points; and wherein the outputting the second decoded bit sequence in response to a second decoded bit sequence passing an error check further comprises outputting a selected one of $2^N-1$ decoded bit sequences that passes the error check, wherein the selected one of $2^N-1$ decoded bit sequences corresponds to one of the $2^N-1$ paths in the Viterbi trellis.

8. The method in a Viterbi decoder according to claim 7 wherein the outputting a selected one of $2^N-1$ decoded bit sequences that passes the error check further comprises:
  rank ordering the $2^N-1$ paths in order of path metric differences between an overall path metric of the ML path and an overall path metric of each respective one of the $2^N-1$ paths;
  error-checking the $2^N-1$ paths in order of path metric differences; and
  outputting a selected one of $2^N-1$ decoded bit sequences in response to passing the error check, wherein the selected one of $2^N-1$ decoded bit sequences corresponds to one of the $2^N-1$ paths in the Viterbi trellis.

9. A Viterbi decoder comprising:
  a controller;
  a Viterbi decoder coupled to the controller for calculating ML path data corresponding to a maximum-likelihood (ML) path, during execution of a first Viterbi algorithm, and alternate path data corresponding to an alternate path, during execution of a second Viterbi algorithm in a Viterbi trellis, wherein the Viterbi trellis has a plurality of nodes corresponding to a plurality of trellis states at a plurality of trellis stages;
  a decoder path memory coupled to the Viterbi decoder for storing data associated with the ML path and the alternate path;
  a merge point selector for selecting a first merge point in the ML path, wherein the merge point selector is coupled to the decoder path memory and the controller, and wherein the first merge point is a node on the ML path that has a smallest path metric difference between an ML path metric at the first merge point and a non-surviving path metric at the first merge point compared to other path metric differences at other nodes on the ML path;
  an alternate path calculator for calculating an alternate path in the Viterbi trellis, wherein the alternate path calculator is coupled to the merge point selector and the decoder path memory, and wherein the alternate path is based on the ML path with a portion of the non-surviving path substituted for a corresponding portion of the ML path at the merge point;
  a path selector for outputting a decoded bit sequence associated with a selected path, wherein the selected path is one of the ML path and the alternate path, the path selector coupled to the controller and the decoder path memory; and
  a path error detector coupled to the path selector for detecting an error in the decoded bit sequence associated with the selected path.

10. The Viterbi decoder according to claim 9 wherein the alternate path calculator comprises:
  a trace-back unit for determining a plurality of alternate path nodes in a non-surviving path at the first merge point; and
  a node substitution unit for substituting the plurality of alternate path nodes for corresponding nodes in the ML path to calculate the alternate path.

11. The Viterbi decoder according to claim 9 wherein the path error detector comprises a cyclic redundancy check (CRC) type error detector.

12. The Viterbi decoder according to claim 9 wherein the merge point selector comprises an N-point merge point selector for selecting N merge points in the ML path, wherein each of the N merge points is a node on the ML path that has one of N smallest path metric differences between an Nth ML path metric at an Nth merge point and an Nth non-surviving path metric at the Nth merge point compared to other path metric differences at other nodes on the ML path.

13. The Viterbi decoder according to claim 12 wherein the N-point merge point selector comprises an N-point merge point selector for selecting N merge points in the ML path during the execution of the second Viterbi algorithm in the Viterbi decoder, wherein the second Viterbi algorithm follows execution of the first Viterbi algorithm that calculates the ML path.

14. The Viterbi decoder according to claim 12 wherein the alternate path calculator comprises an alternate path calculator for computing $2^N-1$ paths in the Viterbi trellis, wherein each of the $2^N-1$ paths is based on the ML path with Boolean combinations of portions of N non-surviving paths at respective N merge points substituted for a corresponding portion of the ML path at the respective N merge points; and wherein the outputting the second decoded bit sequence in response to a second decoded bit sequence passing an error check further comprises outputting a selected one of $2^N-1$ decoded bit sequences that passes the error check, wherein the selected one of $2^N-1$ decoded bit sequences corresponds to one of the $2^N-1$ paths in the Viterbi trellis.

15. The Viterbi decoder according to claim 14 wherein the path selector comprises a path selector for selecting one of the $2^N-1$ paths in the Viterbi trellis and outputting, to the path error detector, a decoded bit sequence corresponding to a selected one of the $2^N-1$ paths.

16. A method in Viterbi decoder comprising:
  computing a maximum likelihood (ML) path in a Viterbi trellis in response to executing a first Viterbi algorithm, wherein the Viterbi trellis includes a matrix of nodes corresponding to a plurality of trellis states at a plurality of trellis stages;
  selecting one or more merge points, during execution of a second Viterbi algorithm, wherein the one or more merge points are each nodes on the ML path, and wherein the one or more merge points each have a path metric difference, wherein the path metric difference at a respective merge point is a difference between an ML path metric at the respective merge point and a non-surviving path metric at the respective merge point, and wherein the one or more merge points are selected based upon relative path metric differences associated with a plurality of nodes on the ML path;

computing one or more alternate paths in the Viterbi trellis, wherein the one or more alternate paths are based on the ML path with portions of one or more non-surviving paths substituted for a corresponding portion the ML path at one or more corresponding merge points; and in response to a passing decoded bit sequence passing an error check, outputting the passing decoded bit sequence, wherein the passing decoded bit sequence is associated with one of the one or more alternate paths.

17. The method in Viterbi decoder according to claim 16 wherein the outputting the passing decoded bit sequence comprises outputting the passing decoded bit sequence in response to the passing decoded bit sequence passing a cyclic redundancy check (CRC) type of error check.

18. The method in Viterbi decoder according to claim 16 wherein the selecting one or more merge points based upon relative path metric differences comprises selecting N merge points corresponding to N number of smallest path metric differences.

19. The method in Viterbi decoder according to claim 16 wherein the selecting one or more merge points based upon relative path metric differences comprises selecting merge points corresponding to path metric differences that fall below a difference threshold.

20. The method in a Viterbi decoder according to claim 16 wherein the selecting one or more merge points further comprises selecting N merge points in the ML path in response to the executing a second Viterbi algorithm, wherein N is an integer greater than 1, and wherein each of the N merge points has one of N smallest path metric differences between an Nth ML path metric at a respective one of the N merge points and an Nth non-surviving path metric at the respective one of the N merge points compared to other path metric differences at other nodes on the ML path.

* * * * *